United States Patent
Sharma et al.

(10) Patent No.: US 6,799,287 B1
(45) Date of Patent: Sep. 28, 2004

(54) METHOD AND APPARATUS FOR VERIFYING ERROR CORRECTING CODES

(75) Inventors: Debendra Das Sharma, Santa Clara, CA (US); Elizabeth S. Wolf, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/562,133

(22) Filed: May 1, 2000

(51) Int. Cl.[7] ............................................. G06F 11/10
(52) U.S. Cl. .......................................... 714/703
(58) Field of Search ..................................... 714/703

(56) References Cited

U.S. PATENT DOCUMENTS

| | | | | |
|---|---|---|---|---|
| 4,794,597 A | * | 12/1988 | Ooba et al. ................ | 714/703 |
| 4,924,465 A | * | 5/1990 | Matsubara et al. ......... | 714/703 |
| 5,001,712 A | * | 3/1991 | Splett et al. ................ | 714/703 |
| 5,502,732 A | * | 3/1996 | Arroyo et al. .............. | 714/746 |
| 5,574,855 A | * | 11/1996 | Rosich et al. ................ | 714/41 |
| 5,812,556 A | * | 9/1998 | Schmidt ..................... | 714/703 |
| 5,872,790 A | * | 2/1999 | Dixon ........................ | 714/703 |
| 5,875,195 A | * | 2/1999 | Dixon ........................ | 714/719 |
| 5,958,072 A | * | 9/1999 | Jacobs et al. ................ | 714/30 |
| 6,182,248 B1 | * | 1/2001 | Armstrong et al. ........... | 714/43 |
| 6,223,309 B1 | * | 4/2001 | Dixon et al. ................ | 714/703 |
| 6,237,116 B1 | * | 5/2001 | Fazel et al. ................ | 714/720 |
| 6,397,357 B1 | * | 5/2002 | Cooper ....................... | 714/703 |
| 6,457,147 B1 | * | 9/2002 | Williams .................... | 714/703 |
| 6,473,871 B1 | * | 10/2002 | Coyle et al. ................ | 714/715 |

OTHER PUBLICATIONS

Cooper, R.J., et al., "Diagnostic Error–Forcing Circuit." IBM Technical Disclosure Bulletin, vol. 19, No. 5, Oct. 1, 1976, p.p. 1833–1834.

European Search Report dated Feb. 24, 2003 corresponding to counterpart EP application No. 01108612.1.

* cited by examiner

*Primary Examiner*—Stephen M. Baker

(57) ABSTRACT

A method and an apparatus verifies the correctness of the error correcting code algorithm and the correctness of the error correcting code implementation. An error injection module is used to inject random errors into an ECC circuit between an encoder and a decoder. The encoder encodes data bits with check bits to produce an encoded signal. A decoder decodes the encoded signal, after modification by the error injection module. The output of the decoder may be a zero error signal, a signal error signal, a multiple error signal, and an error location signal. The output signal is compared to expected values to determine if an error exists in the ECC or the ECC circuit.

8 Claims, 5 Drawing Sheets

METHOD AND APPARATUS FOR VERIFYING ERROR CORRECTING CODES

TECHNICAL FIELD

The technical field is error correcting code for storage or communications systems.

BACKGROUND

Communication and storage systems are subject to errors that may affect operation of connected systems. A typical error may result when a particular memory location is exposed to one or more α particles. Such radiation may cause a data bit stored in the memory location to flip from a "1" to a "0."

Error correcting codes (ECC) are used to enhance reliability and state integrity of communications and storage systems. Error correcting codes are known that will correct a single error, and will detect, but not correct, a double error. Other ECCs will detect and correct multiple errors. For ECC applications, memory array chips may be organized so that errors generated in a chip can be corrected by the ECC.

Correction of single bit errors and detection of double bit errors may be accomplished by use of check bits. A typical ECC implementation appends a number of check bits to each data word. The appended check bits are used by ECC logic circuits to detect errors within the data word. The simplest and most common form of error control is implemented through the use of parity bits. A single parity bit is appended to a data word and assigned to be a 0 or a 1, so as to make the number of 1's in the data word even in the case of even parity codes, or odd in the case of odd parity codes.

Prior to transmission of the data word in a computer system, the value of the parity bit is computed at the source point of the data word and is appended to the data word. On receipt of the transmitted data word, logic at the destination point recalculates the parity bit and compares it to the received, previously appended parity bit. If the recalculated and received parity bits are not equal, a bit error has been detected. Use of parity codes has the disadvantage, however, of not being able to correct bit errors and not being able to detect even numbers of bit errors. For example, if a data bit changes from a 0 to a 1 and another data bit changes from a 1 to a 0 (a double bit error), the parity of the data word will not change and the error will be undetected.

By appending additional parity bits to the data word, each corresponding to a subset of data bits within the data word, the parity bit concept may be extended to provide detection of multiple bit errors, or to determine the location of single or multiple bit errors. Once a data bit error has been detected, logic circuits may be used to correct the erroneous bit, providing single error correction.

A well known error correction code is the Hamming code, which may be a SEC-DED code, for example. The ECC appends a series of check bits to the data word as it is stored in memory. Upon a read operation, the retrieved check bits are compared to recalculated check bits to detect and to locate (i.e., correct) a single bit error. By adding more check bits and appropriately overlapping the subsets of data bits represented by the check bits, other error correcting codes may provide for multiple error correction and detection.

Verifying the correctness of the error correcting code includes two steps: verifying the underlying algorithm of the error correcting code and verifying the implementation of the error correcting code on a hardware device or on a simulation of the hardware device. Current methods for verifying the error correcting code do not link these two steps, and hence do not provide a complete verification. An example of this problem may be shown with respect to linear codes. Linear codes are constructed using properties based on Galois field arithmetic. The proof of the properties in concept may be made within the mathematical framework of Galois fields. Based on this concept, a generator matrix (known as a G matrix), a parity matrix (known as an H matrix), and different syndrome vectors corresponding to various error scenarios are generated, either by hand or by a computer program. A single-error correcting, double-error detecting (SEC-DED) code would have an H matrix in which no two columns are identical and in which the Galois field addition of any two columns is not equal to any column in the H matrix. The mathematical proof of the concept does not detect any error introduced during the generation of the G and H matrices and the syndrome vectors. The G and H matrices and the syndrome vectors are then used in a high-level language to generate the error correcting code circuitry, which may be implemented as a hardware device or a simulation of the hardware device. Verification of the implementation is completed by checking whether the implementation provides expected outputs based on the G and H matrices and the syndrome vectors.

One problem with this conventional approach comes from errors that may occur during generation of the G and H matrices and the syndrome vectors. Such errors may go undetected because no automated tool exists to directly produce the error correcting code circuitry from the mathematical properties.

SUMMARY

A method and an apparatus verifies the correctness of the error correcting code algorithm and the correctness of the error correcting code implementation. An error injection module is used to inject random errors into an ECC circuit between an encoder and a decoder. The encoder encodes data bits with check bits to produce an encoded signal. A decoder decodes the encoded signal, after modification by the error injection module. The error injection module may inject zero errors. Alternatively, the error injection circuit may inject a single error or multiple errors. The output of the decoder may be a zero error signal, a single error signal, a multiple error signal, and an error location signal. Other signals are also possible. The output of the decoder is compared to expected values for each signal using a monitoring module. Any differences between the output signals and the expected values may indicate an error in the ECC or in the circuit used to implement the ECC.

The ECC may be verified by implementing the verification apparatus in an actual hardware device. In this embodiment, the error injection module and the monitoring module may be located on a same chip as the decoder and the encoder. Alternatively, the error injection module and the monitoring module may be located on chips separate from the decoder and the encoder. The ECC verification apparatus may also be implemented as a simulation of the actual hardware device or in a formal verification model of the actual hardware.

DESCRIPTION OF THE DRAWINGS

The detailed description will reference the following figures, in which like numerals refer to like items, and in which.

DETAILED DESCRIPTION

Error correcting code (ECC) circuits are widely used in semiconductor memory designs to correct single-bit errors and to detect double-bit errors. One common ECC code is the SEC-DED (single error correction—double error detection) code. Other ECC codes are capable of detecting more than two errors and correcting more than single errors.

The ECC circuits perform their error checking functions by generating a number of check bits for a specific number of data bits, and then writing the check bits to memory with the data bits. The check bits are then used during subsequent read-write cycles or other memory accesses to verify the correct values for the data bits. The number of check bits required to implement the ECC depends on the number of data bits being read. As shown in Table 1, as a number of data bits being read increases, the number of required ECC bits also increases.

TABLE 1

| Data Bits | ECC Bits |
|---|---|
| 16–31 | 6 |
| 32–63 | 7 |
| 64–127 | 8 |
| 128–255 | 9 |

Figure 1A:
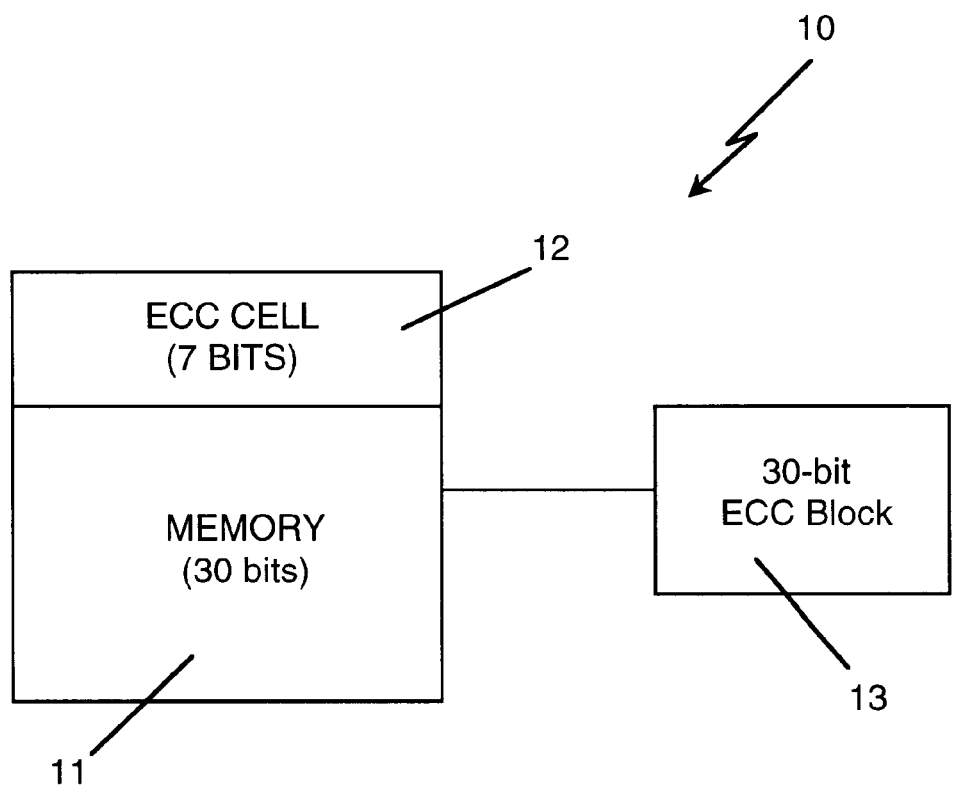
FIGS. 1A and 1B are a block diagrams of an error correcting circuit.

Hardware to implement ECC check bits using current systems is illustrated in FIG. 1a. An error correcting code circuit 10 includes a memory line 11, which is shown in FIG. 1a including 30 data bits. Associated with the memory line 11 is an ECC cell 12. Referring to Table 1 above, six ECC bits are required to be stored in the ECC cell 12 to accomplish single bit error correction and double bit error detection in the memory line 11. An ECC block 13 is used to generate the ECC bits and to perform the error correcting/detecting code operations including checking the data bits in the memory line 11 during read and write operations.

Figure 1B:
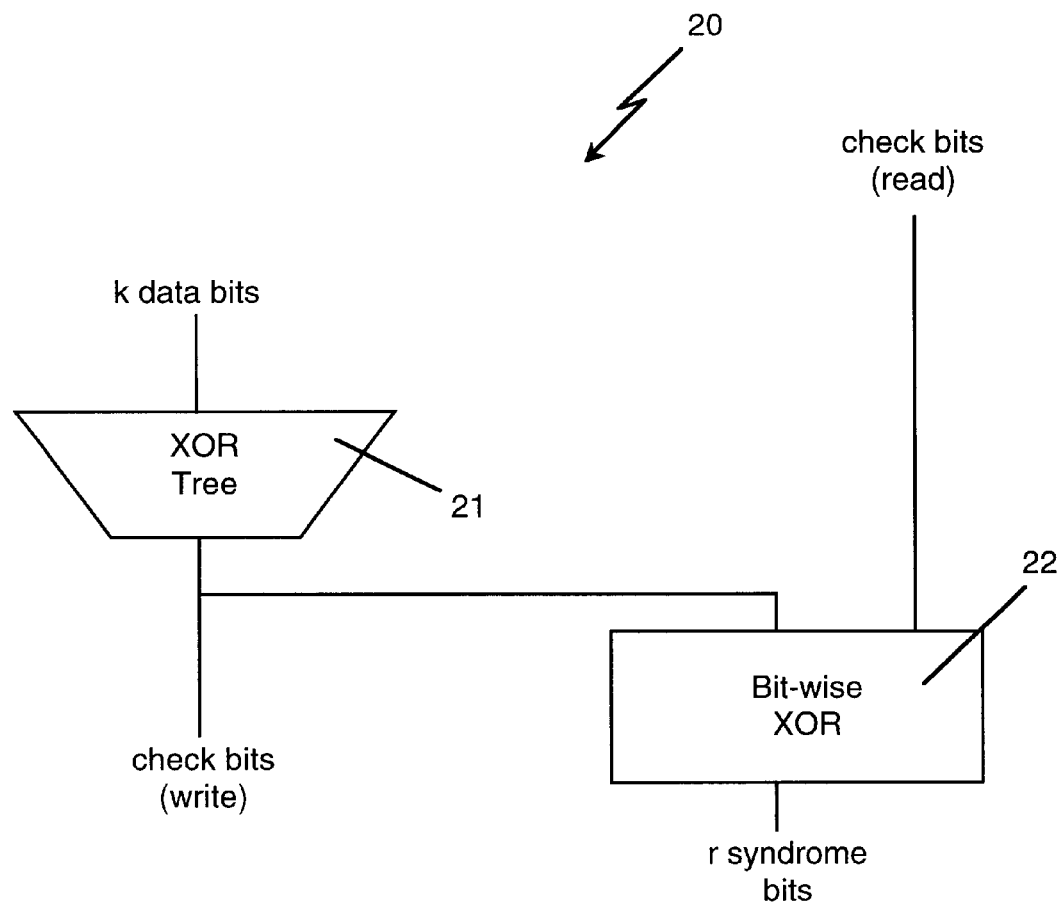

FIG. 1B is a block diagram of a portion of the ECC block 13 that generates check bits and syndrome bits. As is well known in the art, syndrome bits are the product of a comparison of the ECC bits originally stored with the data in the memory during a data store operation, and a new set of ECC bits generated based on the data that has been fetched from the memory such as would occur during execution of a read command, or any memory access, in a computer system. That is, a syndrome bit is simply the XOR of a corresponding received ECC bit with a newly generated ECC bit. If the combination of the retrieved and the newly generated ECC bits creates any non-zero syndrome bits, an error within the retrieved data has been detected.

In FIG. 1B, a circuit 20 includes an XOR tree 21 and a bit-wise XOR module 22. In a write operation, the ECC bits are generated simultaneously by processing the data bits using a parity check matrix, for example. Such generation of ECC bits is well known in the art. In a read operation, the syndrome bits are generated simultaneously from the data bits read according to standard decoding processes. The same XOR tree 21 may be used for both the ECC bits and the syndrome bits as shown in FIG. 1B.

Current approaches for generating the ECC and associated circuitry (hardware or hardware simulation) do not account for possible errors in the underlying algorithm. Thus, application of the ECC in an implementation may not ensure all errors are correctly corrected or detected. This may be particularly true when the ECC is a combination of linear codes and arithmetic codes, or some other custom codes that do not follow standard procedures.

To overcome this problem, an apparatus and a method subject the implementation of the ECC circuit to the various errors the ECC circuit is expected to correct/detect. The apparatus and the method verifies the ECC concept, the algorithm, and the implementation simultaneously.

Figure 2:
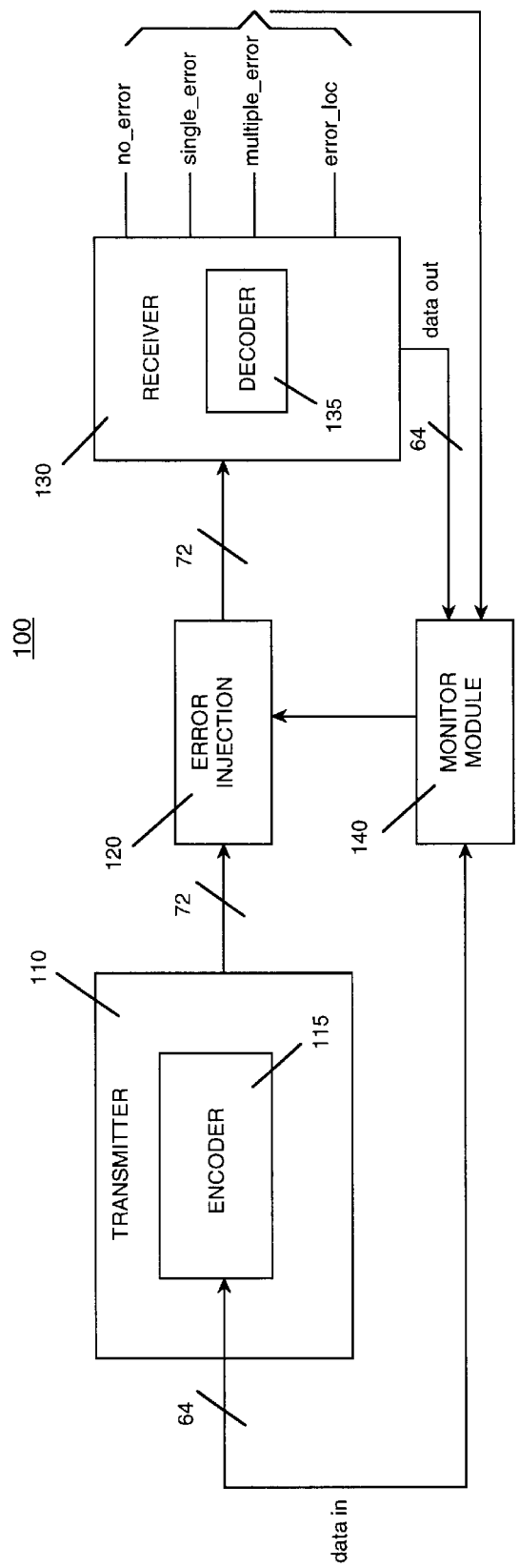
FIG. 2 is a block diagram of an apparatus for verifying an error correcting code and circuit.

FIG. 2 is a block diagram illustrating the apparatus and the method for verifying ECC. In FIG. 2, an apparatus 100 includes a transmitter 110 having an encoder 115. The transmitter 110 and the encoder 115 are coupled through an error injection circuit 120 to a receiver 130 having a decoder 135. Also coupled to the encoder 115 and the decoder 135 is a monitoring module 140. As noted above, the apparatus 100 may be implemented as an actual hardware device, or may be implemented as a simulation of a hardware device, using a hardware description language, such as VHDL or Verilog, for example, both of which are known in the art.

The method and the apparatus 100 function to completely test the ECC by the coupling of the encoder 115 and the decoder 135 and then injecting possible errors. In operation, data are input to the encoder 115. The encoder 115 encodes the data to produce an output vector 112. In the example illustrated in FIG. 2, the data input is 64 bits wide. Referring to Table 1, the encoder will encode an additional 8 bits to the data input such that the output vector 112 is 72 bits wide. The output vector 112 is sent through error injection circuit 120, which introduces errors that the ECC is capable of correcting or detecting. The error injection circuit 120 also tests the ECC and its implementation by not introducing errors (a zero error case). The modified data are then fed directly to the decoder 135.

The decoder 135 decodes the modified data and produces several output signals. The output signals may include a data out signal, a no error signal, a single error signal and a double (multiple) error signal. The decoder 135 may also provide an error_loc signal, which indicates a location of a bit in error. The error_loc signal may be similar to the syndrome mentioned above. Other output signals may also be provided. These output signals are provided to the monitoring module 140. The monitoring module 40 determines if the provided output signals are as expected. If the output signals are not as expected, then a problem may exist with the ECC or the ECC circuit. For the example of a SEC-DED ECC, if there are no errors injected, the expected results are: an output signal no_error is set equal to 1; output signals single_error and multiple_error are set equal to 0, and a 64-bit signal data_out=data_ in.

The error injection circuit 120 then injects single errors, one for each of the 72 bits. Again, the output signals from the decoder 135 are provided to the monitoring module 140, which determines if the provided output signals match the expected output signals. For the example of a SEC-DED ECC, the expected results are: data_out=data_in (indicating the error was corrected), single_error=1, and no_error=multiple error=0. An error_loc signal may also be output.

The apparatus 100 also checks for proper operation of the ECC in the presence of multiple errors. To check for double errors, the error injection circuit 120 injects double errors (there are 2556 possibilities in this example). The expected result is no_error=single_error=0; multiple_error=1.

Because the ECC in this example is a SEC-DED, the monitor module does not compare data_out=data in.

The apparatus 100 may be implemented in various ways, depending on the ECC verification methodology. The error injection circuit 120 may be implemented as an XOR of the data_out bits with a binary error vector of the same width as the data_out bits. The binary error vector may be randomly generated in a simulation environment for all the different error types. These error types include no error, single error and double error, for example. The binary error vector may also be hand coded and supplied to the error injection circuit 120. Similarly, a formal verification module may include all error scenarios.

To verify proper operation of the ECC, including the underlying algorithm and the ECC circuit, the apparatus 100 may be used with any type of memory in a computer system. For example, the ECC circuit 100 may be used with cache and with main memory. The apparatus may be used with any ECC. While the proceeding discussion described operation of the apparatus 100 with a SEC-DED. one of ordinary skill in the art would understand the method and the apparatus 100 may be used with ECCs that are capable of detecting and correcting multiple errors (e.g., DEC-TED codes).

The apparatus 100 may be included on a dual in-line memory module (DIMM) card along with one or more memory chips and may be implemented within an ASIC chip, for example. The ASIC chip would serve to interconnect a data bus (not shown) of the computer system to the memory chips. Data passing from the data bus to the memory chips during execution ow a write operation would pass through the apparatus 100 prior to storage in the memory chips. Likewise, data passing from the memory chips to the data bus would also pass through the apparatus 100. Thus, the error detection and correction mechanism operates on the data as the data is being stored by the computer system in the memory chips.

In the embodiment shown in FIG. 2, the data bus coupling the transmitter 110 and receiver 130 has sufficient bandwidth to carry all 72 bits in one clock cycle. However, the apparatus 100 may also be used with system busses having smaller bandwidths. In this case, multiple cycles may be needed to transmit all the data ad check bits.

Figure 3A:
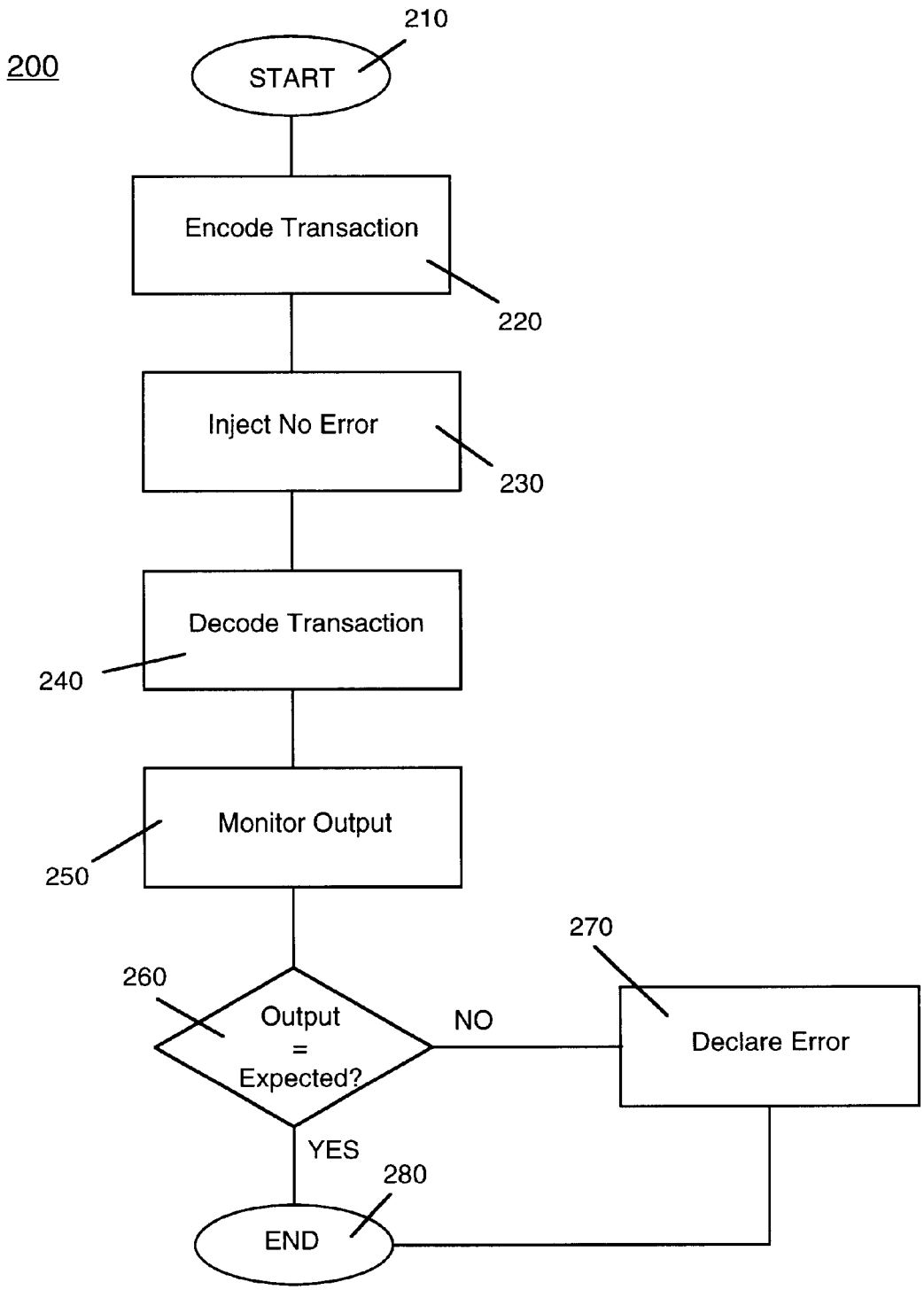
FIGS. 3A and 3B are flow charts showing processes executed on the apparatus of FIG. 2.
Figure 3B:
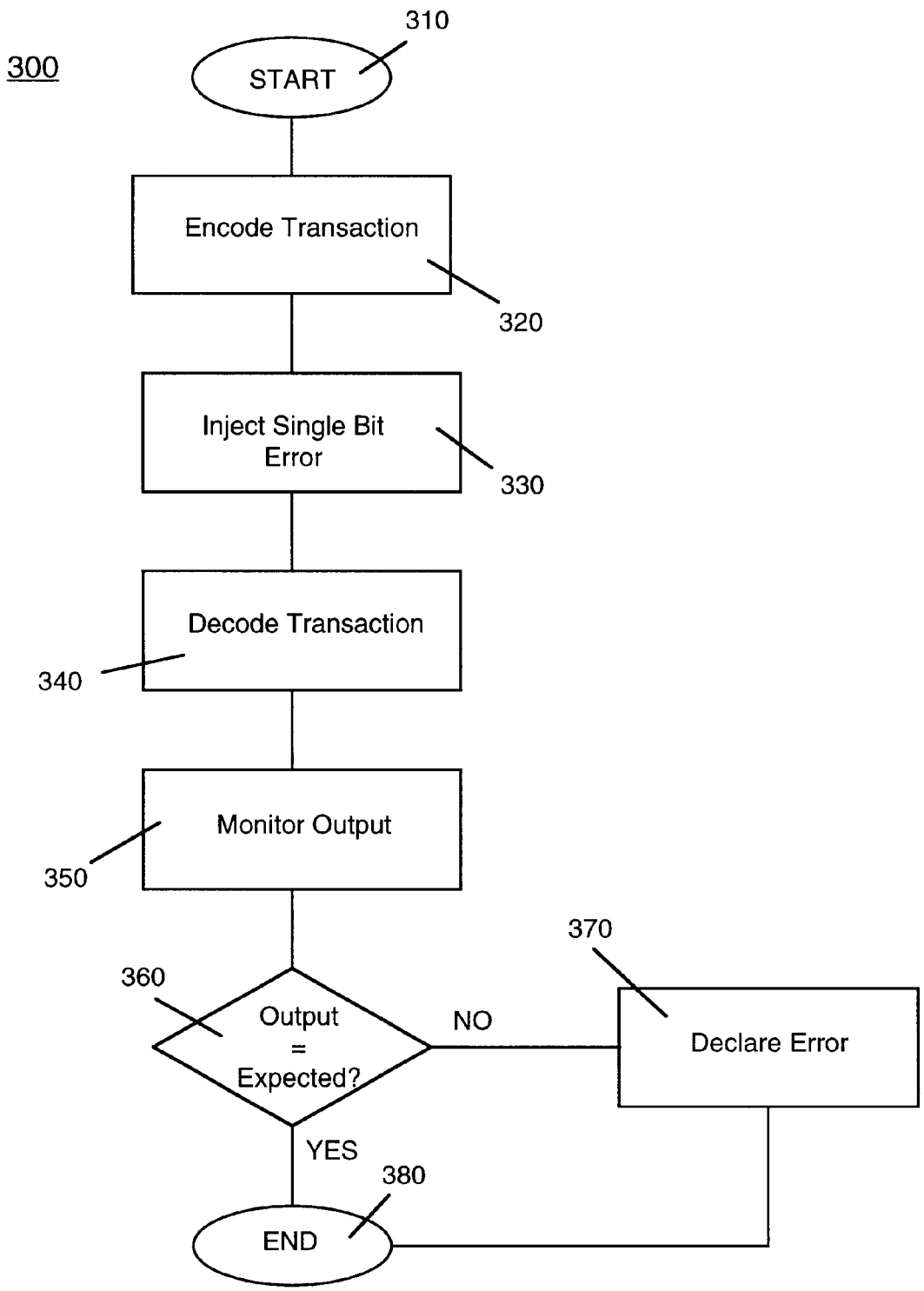

FIGS. 3A and 3B illustrate processes that may be executed using the apparatus 100 shown in FIG. 2. FIG. 3A illustrates a process 200 when a no error signal is injected. The process begins with block 210. In block 220, the encoder 115 encodes a transaction with an ECC. The transaction is then processed in error injection circuit 120, and a no error signal is injected, block 230.

In block 240, the transaction is decoded using the ECC. In block 250, the monitor module 140 monitors the decoded transaction. In block 260, the monitor module compares the decoded transaction with the expected results. In this case, if the ECC code and circuit operate correctly, the 64-bit signal data_out=data_in, the output signal no_error is set equal to 1, and the output signals single_error and multiple_errors equal 0. If no error in operation of the ECC or the ECC circuit are noted, the process moves to block 280 and ends. Otherwise, the process moves to block 270, and an error is declared. The process then moves to block 280 and ends.

FIG. 3B illustrates a process 300 in which the error injection circuit 120 inserts a single-bit error. The process 300 is similar to the process 200 except that the expected output signals are data_out=data_in (the single bit error being corrected by the ECC), single_error=1, and multiple_errors and no_error equal 0.

The terms and descriptions used herein are set forth by way of illustration only and are not meant as limitations. Those skilled in the art will recognize that many variations are possible within the spirit and scope of the invention as defined in the following claims, and their equivalents, in which all terms are to be understood in their broadest possible sense unless otherwise indicated.

What is claimed is:

1. An apparatus for verifying an error correcting code (ECC) operating in an ECC circuit, comprising:

an encoder that encodes data bits to produce an encoded signal, the encoded signal comprising the data bits and check bits;

an error injection module coupled to the encoder and capable of injecting an error signal into the encoded signal, the error injection module producing an output signal comprising one of a no error condition, a single error condition, and a multiple error condition;

a decoder coupled to the error injection module that decodes the output signal to produce one or more decoded output signals, the decoded output signals comprising a no error signal, a single error signal, and a multiple error signal; and a monitor module that reads the decoded output signals, wherein when a no error condition is produced, the no error signal equals one of a binary 0 and 1.

2. The apparatus of claim 1, wherein the apparatus is embodied as a simulation of a hardware device.

3. The apparatus of claim 1, wherein the apparatus is embodied as a hardware device.

4. The apparatus of claim 1, wherein the apparatus is embodied in a hardware device.

5. The apparatus of claim 1, wherein the apparatus is embodied in one of a simulator and an emulator.

6. The apparatus of claim 1, wherein the monitor module provides one or more comparison signals and the data bits to indicate a condition of the ECC and the ECC circuit.

7. The apparatus of claim 6, wherein the one or more comparison signals comprise a no error comparison signal, a single error comparison signal, a multiple error comparison signal and an error location comparison signal.

8. The apparatus of claim 7, wherein the one or more comparison signals further comprises a data out=data in signal, wherein the data out=data in signal is provided when the no error or the single error condition exists.

* * * * *